US00RE35765E

United States Patent [19]

Tuttle

[11] E Patent Number: Re. 35,765

[45] Reissued Date of Patent: Apr. 7, 1998

[54] METHOD FOR REDUCING CONDUCTIVE AND CONVECTIVE HEAT LOSS FROM THE BATTERY IN AN RFID TAG OR OTHER BATTERY-POWERED DEVICES

[75] Inventor: John R. Tuttle, Boise, Id.

[73] Assignee: Micron Communications, Inc., Boise, Id.

[21] Appl. No.: 667,415

[22] Filed: Jun. 21, 1996

Related U.S. Patent Documents

Reissue of:

[64] Patent No.: 5,323,150
Issued: Jun. 21, 1994
Appl. No.: 897,224
Filed: Jun. 11, 1992

[51] Int. Cl.[6] ..... H01L 23/28; H01L 23/29

[52] U.S. Cl. ..... 340/825.54; 174/52.2; 257/792; 257/795; 429/98

[58] Field of Search ..... 340/825.54; 429/82, 429/96, 98, 100, 112, 120, 121, 122, 163, 185; 437/207, 209; 174/61, 62, 52.2, 52.4; 257/668, 676, 687, 787, 788, 792, 795

[56] References Cited

U.S. PATENT DOCUMENTS

| | | | |
|---|---|---|---|
| 3,859,652 | 1/1975 | Hall et al. | 340/288 |
| 3,864,170 | 2/1975 | Krieger | 429/112 |
| 4,260,983 | 4/1981 | Falck et al. | 340/572 |
| 4,274,083 | 6/1981 | Tomoeda | 340/171 R |
| 4,403,023 | 9/1983 | Reiss | 429/120 |
| 4,539,660 | 9/1985 | Miyauchi et al. | 365/229 |
| 4,547,438 | 10/1985 | McArthur et al. | 429/159 |
| 4,572,976 | 2/1986 | Fockens | 307/524 |
| 4,646,090 | 2/1987 | Mawhinney | 342/44 |
| 4,654,658 | 3/1987 | Walton | 340/825.54 |
| 4,656,472 | 4/1987 | Walton | 340/825.34 |
| 4,724,427 | 2/1988 | Carroll | 340/572 |
| 4,730,188 | 3/1988 | Milheiser | 340/825 |
| 4,782,342 | 11/1988 | Walton | 340/553 |
| 4,812,897 | 3/1989 | Narita et al. | 257/687 |
| 4,854,328 | 8/1989 | Pollack | 128/736 |
| 4,857,893 | 8/1989 | Carroll | 340/572 |
| 4,888,634 | 12/1989 | Lai et al. | 257/795 |
| 4,997,732 | 3/1991 | Austin et al. | 429/185 |
| 5,089,877 | 2/1992 | Queyssac et al. | 174/52.4 |

*Primary Examiner*—Michael Horabik
*Assistant Examiner*—Edward Merz
*Attorney, Agent, or Firm*—Trask, Britt & Rossa

[57] ABSTRACT

The present invention introduces a method of reducing conductive and convective heat loss from the battery unit in battery-powered devices, such as RFID tag devices. Battery heat loss prevention is accomplished by suspending the battery in a vacuum or within a low thermally conductivity gas, such as air, nitrogen, helium or argon. Further improvement is accomplished by using a minimum number of suspension points made of solid material which possesses a low thermally conductivity. The battery can be suspended by various means, the first of which totally encapsulates the battery using the minimum number of solid material suspension points mentioned above, and the second of which only a portion of the battery (such as the lower portion) is suspended in a low thermally conductive material and the upper portion is encapsulated by the low thermally conductive material fabricated in an arching structure that does not contact the upper portion of the battery. Both approaches allow suspension of the integrated circuit (IC) to be driven by the battery within the same confines of the battery by bonding the IC to the upper surface of the battery with the IC thereby residing underneath either the top solid material structure of the first approach or the arching structure of solid material of the second approach.

77 Claims, 1 Drawing Sheet

METHOD FOR REDUCING CONDUCTIVE AND CONVECTIVE HEAT LOSS FROM THE BATTERY IN AN RFID TAG OR OTHER BATTERY-POWERED DEVICES

Matter enclosed in heavy brackets [ ] appears in the original patent but forms no part of this reissue specification; matter printed in italics indicates the additions made by reissue.

FIELD OF THE INVENTION

This invention relates generally to the field of battery powered IC devices such as radio frequency transceiver systems, and in particular, radio frequency identification (RFID) devices (or tags). More specifically, a method is disclosed that prevents battery heat loss in battery-powered devices, such as in an RFID tag.

BACKGROUND OF THE INVENTION

The field of RFID systems has evolved over the past years from systems developed in relatively large packages (size of a cigarette package) containing battery powered transmission/receiving circuitry or transceiver, such as the identification system disclosed in U.S. Pat. No. 4,274,083, to passive systems (the size of a credit card) in which the transceiver receives its power from the base station or interrogator, such as the identification system disclosed in U.S. Pat. No. 4,654,658.

Although a low-cost RFID system having a battery powered transceiver allows for greater distance between the interrogator and the transceiver units, the physical size of the transceiver unit has pushed the industry towards the passive transceiver, technology as disclosed in U.S. Pat. No. 4,654,658 and 4,730,188. However, the limit in RF communication distance between transceiver and interrogator in low-cost passive systems is in the 2 foot or less range if reasonable accuracy of information collected is to be achieved and low power, low-cost interrogators are to be used.

The memory used in RFID systems depends on the type of system used wherein, most passive systems use a programmable read only memory (PROM) of some sort that will retain its programmed data even when power is disrupted or removed while a battery backed system may use any memory type, including random access memory (RAM), that requires a continuous power source to retain programmed data.

Though an RFID system may vary in transceiver type, the memory used and circuitry configuration, a battery backed system is more desirable as a greater communication range is possible allowing for more remote placement of the RFID tag itself. Since the performance of a battery degrades at low temperatures, the longer the battery temperature can be maintained at higher temperatures, the better. The present invention discloses a unique method of reducing conductive and convective heat loss from the battery unit in an RFID tag or other battery-powered devices to allow improved operation of compatible RFID systems that will readily be recognized by one skilled in the art in accordance with the present invention described herein.

All U.S. Patents cited herein are hereby incorporated by reference.

SUMMARY OF THE INVENTION

The present invention introduces a method of reducing conductive and convective heat loss from the battery unit in battery-powered devices, such as RFID tag devices.

The present invention accomplishes reduction of battery heat loss by suspending the battery in a vacuum or within a low thermally conductive gas, such as air, nitrogen, helium or argon. The thermal conductivity constant (represented by the lower case letter "k") of the gases mentioned above at 32° C. are:

Argon, k=0.00915,
Air, k=0.0140,
Nitrogen, k=0.0140, and
Helium, k=0.0818.

The lower the thermal conductivity constant the lesser the amount of heat that the gases will dissipate, therefore it would be ideal to have the battery suspended in a vacuum while enclosed in a package, since a vacuum has infinite thermal conductivity resistance in ideal conditions.

Further improvement is accomplished by using a minimum number of suspension points made of solid material which possesses a low thermally conductivity, such as polyester (valox) which has a thermal conductivity constant of k=9.822. With a minimum number of suspension points (one suspension tip per surface), the thermal conductivity of the solid material would be reduced by more than 10 times.

The circuit being powered by the suspended battery could also be suspended in the same space as the battery or in its separate space in close proximity to the suspender battery.

The battery can be suspended by various means, the first of which totally encapsulates the battery using the minimum number of solid material suspension points mentioned above, and the second of which only a portion of the battery (such as the lower portion) is suspended in a low thermally conductive material and the upper portion is encapsulated by the low thermally conductive material fabricated in an arching structure that does not contact the upper portion of the battery.

Both approaches allow suspension of the integrated circuit (IC) to be driven by the battery within the same confines of the battery by bonding the IC to the upper surface of the battery with the IC thereby residing underneath either the top solid material structure of the first approach or the arching structure of solid material of the second approach.

Another benefit of these low heat dissipation methods is that energy generated from heating of the battery during its normal operation will be retained, thus raising the temperature of the battery for a longer period of time, during which the battery will perform at higher efficiency.

Implementation of the present invention will become readily understandable to one skilled in the art in the detailed description that follows.

DETAILED DESCRIPTION OF THE PREFERRED EMBODIMENTS

Figure 1:
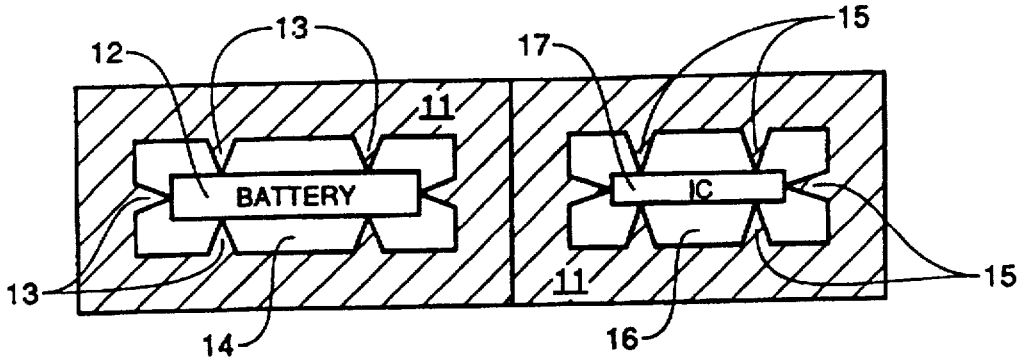
FIG. 1 shows a composite cross-sectional view of a first embodiment of the present invention depicting a battery and an IC suspended in separate spaces by a low thermally conductive material in close proximity to one another.
Figure 2:
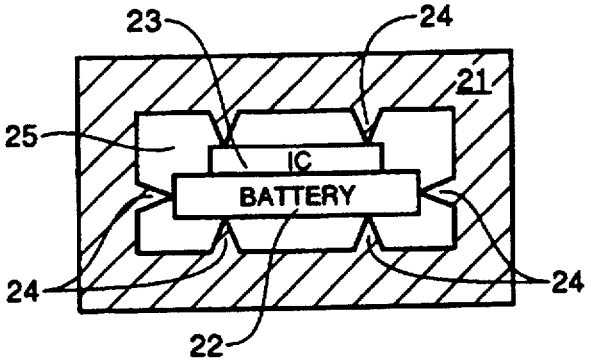
FIG. 2 shows a composite cross-sectional view of a second embodiment of the present invention depicting a battery and an IC suspended in the confines of the same solid low thermally conductive material.
Figure 3:
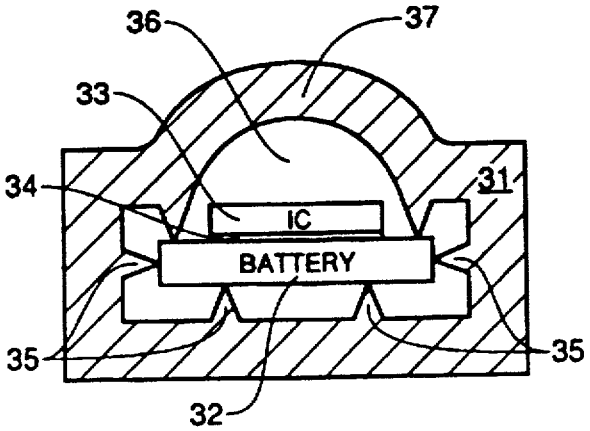
FIG. 3 shows a composite cross-sectional view of a third embodiment of the present invention depicting a battery and an IC suspended in the confines of the same solid low thermally conductive material processes into an arching structure.

Several embodiments of the present invention are disclosed with a first embodiment depicted in FIG. 1 of a battery and an IC suspended in separate spaces by a low thermally conductive material in close proximity to one another; a second embodiment depicted in FIG. 2 depicting a battery and an IC suspended in the confines of the same solid low thermally conductive material; and a third embodiment shown in FIG. 3 depicting a battery and an IC suspended in the confines of the same solid low thermally conductive material processes into an arching structure all of which are described hereinafter. The concepts of the preferred embodiments can be incorporated, by one skilled in the art, into fabricated devices using battery power, such as RF transceiver systems and in particular into a RFID tag.

Referring now to FIG. 1, a low thermally conductive material 11 is fabricated to enclose battery 12 in a suspended enclosure by the presence of suspension tips 13. The number of suspension tips 13 in the example provided in the cross-section of FIG. 1 shows 7 suspension tips: three supporting the lower portion of battery 12; one supporting each sides of battery 12; and two supporting the upper portion of battery 12. The actual number of suspension tips will vary according to the size of battery, but optimum battery heat loss prevention will result by fabricating the minimum number of suspension tips necessary to provide adequate support for battery 12. The resulting space 14 between low thermally conductive material 11 and battery 12 may be left as a vacuum or filled with a suitable insulating gas such as argon, nitrogen, helium or simply air.

In a like manner, IC 17 has been suspended separately in low thermally conductive material 11. Suspension tips 15 support IC17 in space 16. IC 17 is suspended separately from battery 12 to prevent the IC die from raising to the temperature of the battery. Although not shown, positive and negative leads from the battery's terminals connect to IC 17 to supply operating power.

Referring now to FIG. 2, a low thermally conductive material 21 is fabricated to enclose mutually constructed battery 22 and IC 23 in a suspended manner by the presence of suspension tips 24. As in FIG. 1, the number of suspension tips 24 in the example provided in the cross-section of FIG. 2 shows 6 suspension tips: three supporting the lower portion of battery 22; one supporting each sides of battery 22; and two supporting the upper portion of IC 23. Again, the actual number of suspension tips will vary according to the size of battery, but optimum battery heat loss prevention will result by fabricating the minimum number of suspension tips necessary to provide adequate support for the combinational structure comprising battery 22 and IC 23. The resulting space 25 between low thermally conductive material 21 and the structure of battery 22 and IC 23 may also be a vacuum or filled with a suitable low thermally conductive gas such as argon, nitrogen, helium or simply air.

Referring now to FIG. 3, a low thermally conductive material 31 is fabricated to enclose battery 32 and IC 33 in a suspended manner by the presence of suspension tips 35. IC 33 has been attached to battery 32 by bonding agent 34 (such as epoxy) to eliminate the need for suspension tips to contact the upper surface of IC 33. In this arrangement, low thermally conductive material 31 is fabricated to form an arching component 37 overlying IC 33. The presence of arch 37 and the lack of suspension tips contacting IC 33 avoid the possibility of outside pressure being applied to IC 33. In this embodiment, the number of suspension tips 35 in the example provided in the cross-section of FIG. 3 shows 6 suspension tips: two supporting the lower portion of battery 32; one supporting each sides of battery 32; and two supporting an outside upper portion of battery 32. Again, the actual number of suspension tips will vary according to the size of battery, but optimum battery heat loss prevention will result by fabricating the minimum number of suspension tips necessary to provide adequate support for the combinational structure comprising battery 32 and IC 33. The resulting space 36 between low thermally conductive material 31 and the structure of battery 32 and IC 33 may also be a vacuum or filled with a suitable low thermally conductive gas such as argon, nitrogen, helium or simply air.

The lower the thermal conductivity constant the lesser the amount of heat that the gases will dissipate, therefore in the three embodiments discussed, it would be ideal to have the battery and/or IC suspended in a vacuum while enclosed in a package, since a vacuum has infinite thermal conductivity resistance in ideal conditions.

In the case where the solid material used to encapsulate the battery and/or IC is polyester, a mold of each half of the needed package size having the desired number of suspension points would be one method of forming the package. The battery and/or IC combination could be attached to one of the molded halves and the other half of the package then combined to the first molded half. The package would need to be sealed in an air-tight fashion in order to allow an injection of gas or the creation of a vacuum.

Although molding the polyester in order to encapsulate the battery and/or IC combination is suggested, other encapsulation methods known to those skilled in the art may be used without departing from the scope of the invention.

It is to be understood that although the present invention has been described in several embodiments, various modifications known to those skilled in the art, such as substituting other gases for argon, nitrogen, helium or air and rearranging the orientation of the battery and IC relationship, may be made without departing from the invention as recited in the several claims appended hereto.

I claim:

1. A battery powered unit comprising an integrated circuit (IC) and a battery for powering said IC wherein said IC and said battery are enclosed in a low thermally conductive material having a thermal conductivity constant less than k=10, and suspended therein by multiple pointed suspension tips comprising said low thermally conductive material.

2. The battery powered unit of claim 1 wherein said thermally conductive material is polyester.

3. The battery powered unit or claim 1 wherein said IC and said battery are separately enclosed in said thermally conductive material.

4. The battery powered unit of claim 1 wherein said IC and said battery are adjacently enclosed in said thermally conductive material.

5. The battery powered unit of claim 3 wherein said thermally conductive material arches over said IC without making direct contact.

6. The battery powered unit of claim 3 wherein said IC is attached to said battery by bonding means.

7. The battery powered unit of claim 6 wherein said bonding means comprises epoxy.

8. The battery powered unit of claim 1 wherein said suspending IC and said battery within said thermal conductive material forms areas of spacing therebetween.

9. The battery powered unit of claim 8 wherein said areas of spacing comprise a vacuum.

10. The battery powered unit of claim 8 wherein said areas of spacing comprise insulating gas.

11. The battery powered unit of claim 10 wherein said insulating gas is selected from the group consisting of argon, nitrogen, helium and air.

12. A battery powered unit comprising an integrated circuit (IC) and a battery for powering said IC wherein said IC and said battery are enclosed in a low thermally conductive material having a thermal conductivity constant less than k=10, and suspended therein by multiple pointed suspension tips comprising said low thermally conductive material;

wherein said IC is attached to said battery by a bonding means and said thermally conductive material arches over said IC without making direct contact to said IC.

13. The battery powered unit of claim 12 wherein said thermally conductive material is polyester.

14. The battery powered unit of claim 12 wherein said bonding means comprises epoxy.

15. The battery powered unit of claim 12 wherein said suspending IC and said battery within said thermal conductive material forms areas of spacing therebetween.

16. The battery powered unit of claim 15 wherein said area of spacing comprise a vacuum.

17. The battery powered unit of claim 15 wherein said areas of spacing comprise insulating gas.

18. The battery powered unit of claim 17 wherein said insulating gas is selected from the group consisting of argon, nitrogen, helium and air.

19. A radio frequency (RF) transceiver system comprising first and second sending/receiving units wherein said second sending/receiving unit comprises a communication integrated circuit (IC) and a battery for powering said communication IC wherein said IC and said battery are enclosed in a low thermally conductive material having a thermal conductivity constant less than k=10, and suspended therein by multiple pointed suspension tips comprising said low thermally conductive material.

20. The radio frequency transceiver system of claim 19 wherein said thermally conductive material is polyester.

21. The radio frequency transceiver system of claim 19 wherein said IC and said battery are separately enclosed in said thermally conductive material.

22. The radio frequency transceiver system of claim 19 wherein said IC and said battery are adjacently closed in said thermally conductive material.

23. The radio frequency transceiver system of claim 22 wherein said IC is attached to said battery by bonding means.

24. The radio frequency transceiver system of claim 23 wherein said bonding means comprises epoxy.

25. The radio frequency transceiver system of claim 19 wherein said suspending IC and said battery within said thermal conductive material forms areas of spacing therebetween.

26. The radio frequency transceiver system of claim 25 wherein said areas of spacing comprise a vacuum.

27. The radio frequency transceiver system of claim 25 wherein said areas of spacing comprise insulating gas.

28. The radio frequency transceiver system of claim 27 wherein said insulating gas is selected from the group consisting of argon, nitrogen, helium and air.

29. A radio frequency (RF) transceiver system comprising first and second sending/receiving units wherein said second sending/receiving unit comprises a communication integrated circuit (IC) and a battery for powering said communication IC wherein said IC and said battery are enclosed in a low thermally conductive material having a thermal conductivity constant less than k=10, and suspended therein by multiple pointed suspension tips comprising said low thermally conductive material;

wherein said IC is attached to said battery by a bonding means and said thermally conductive material arches over said IC without making direct contact to said IC.

30. The radio frequency transceiver system of claim 29 wherein said thermally conductive material is polyester.

31. The radio frequency transceiver system of claim 29 wherein said bonding means comprises epoxy.

32. The radio frequency transceiver system of claim 29 wherein said suspending IC and said battery within said thermal conductive material forms areas of spacing therebetween.

33. The radio frequency transceiver system of claim 32 wherein said areas of spacing comprise a vacuum.

34. The radio frequency transceiver system of claim 32 wherein said areas of spacing comprise insulating gas.

35. The radio frequency transceiver system of claim 34 wherein said insulating gas is selected from the group consisting of argon, nitrogen, helium and air.

*36. A method of insulating a battery powered unit including an integrated circuit having a plurality of surfaces and a battery having a plurality of surfaces for powering said integrated circuit, said method comprising the steps of:*

*forming a low thermally conductive material to enclose said battery therein, the low thermally conductive material being formed having a plurality of suspension tips, at least one suspension tip for engaging at least one surface of said plurality of said surfaces of said battery; and*

*suspending said battery within the low thermally conductive material by at least one suspension tip of the plurality suspension tips of the low thermally conductive material contacting at least one surface of said plurality of surfaces of said battery.*

*37. The method of claim 36, wherein the low thermally conductive material having a thermal conductivity constant less than k=10.*

*38. The method of claim 36, wherein the low thermally conductive material includes polyester.*

*39. The method of claim 36, wherein the step of suspending said battery within the low thermally conductive material includes:*

*suspending said battery in a first portion of the low thermally conductive material; and*

*suspending said integrated circuit in a second portion of the low thermally conductive material.*

*40. The method of claim 29, wherein the first portion of the low thermally conductive material is separate from the second portion of the low thermally conductive material.*

*41. The method of claim 39, wherein said battery is suspended adjacent said integrated circuit in the low thermally conductive material.*

*42. The method of claim 39, wherein the step of suspending said battery within the low thermally conductive material includes:*

*suspending said battery in a first portion of the low thermally conductive material; and*

*suspending said integrated circuit in a second portion of the low thermally conductive material, the second portion of the low thermally conductive material arching over said integrated circuit without making direct contact with the low thermally conductive material.*

*43. The method of claim 36, further comprising the step of:*

*attaching said integrated circuit to said battery.*

*44. The method of claim 43, wherein the step of attaching said integrated circuit to said battery includes bonding said integrated circuit to said battery.*

*45. The method of claim 43, wherein the step of attaching said integrated circuit to said battery includes using epoxy to bond said integrated circuit to said battery.*

*46. The method of claim 36, wherein the step of suspending said battery within the low thermally conductive material includes:*

*suspending said battery within the low thermally conductive material by at least one suspension tip of the plurality of suspension tips of the low thermally conductive material contacting at least one surface of said plurality of surfaces of said battery, the plurality of suspension tips of the low thermally conductive material forming areas of spaces therebetween.*

*47. The method of claim 46, further comprising the step of:*

*evacuating the areas of spaces formed between the plurality of suspension tips of the low thermally conductive material.*

*48. The method of claim 46, further comprising the step of:*

*placing insulating gas in the areas of spaces formed between the plurality of suspension tips of the low thermally conductive material.*

*49. The method of claim 46, further comprising the step of:*

*placing insulating gas in the areas of spaces formed between the plurality of suspension tips of the low thermally conductive material, the insulating gas being selected from the group consisting of argon, nitrogen, helium and air.*

*50. A method of insulating a battery powered unit including an integrated circuit having a plurality of surfaces and a battery having a plurality of surfaces for powering said integrated circuit, said method comprising the steps of:*

*forming a low thermally conductive material to enclose said battery therein, the low thermally conductive material being formed having a plurality of suspension tips, at least one suspension tip for engaging at least one surface of said plurality of said surfaces of said battery;*

*attaching said integrated circuit to said battery by bonding said integrated circuit to said battery;*

*suspending said battery in a first portion of the low thermally conductive material; and*

*suspending said integrated circuit in a second portion of the low thermally conductive material, the second portion of the low thermally conductive material arching over said integrated circuit without making direct contact with the low thermally conductive material.*

*51. The method of claim 50, wherein the low thermally conductive material having a thermal conductivity constant less than k=10.*

*52. The method of claim 50, wherein the low thermally conductive material includes polyester.*

*53. The method of claim 50, wherein the step of attaching said integrated circuit to said battery includes using epoxy to bond said integrated circuit to said battery.*

*54. The method of claim 50, wherein the step of suspending said battery within the low thermally conductive material includes:*

*suspending said battery within the low thermally conductive material by at least one suspension tip of the plurality of suspension tips of the low thermally conductive material contacting at least one surface of said plurality of surfaces of said battery, the plurality of suspension tips of the low thermally conductive material forming areas of spaces therebetween; and*

*suspending said integrated circuit within the low thermally conductive material by at least one suspension tip of the plurality of suspension tips of the low thermally conductive material contacting at least one surface of said plurality of surfaces of said battery, the plurality of suspension tips of the low thermally conductive material forming areas of spaces therebetween.*

*55. The method of claim 54, further comprising the steps of:*

*evacuating the areas of spaces formed between the plurality of suspension tips of the low thermally conductive material.*

*56. The method of claim 54, further comprising the step of:*

*placing insulating gas in the areas of spaces formed between the plurality of suspension tips of the low thermally conductive material.*

*57. The method of claim 54, further comprising the step of:*

*placing insulating gas in the areas of spaces formed between the plurality of suspension tips of the low thermally conductive material, insulating gas being selected from the group consisting of argon, nitrogen, helium, and air.*

*58. A method of making a radio frequency transceiver system including first and second sending/receiving units wherein said second sending/receiving unit includes a communication integrated circuit having a plurality of surfaces and a battery having a plurality of surfaces for powering said communication integrated circuit, said method comprising the steps of:*

*forming a low thermally conductive material to enclose said communication integrated circuit and said battery therein, the low thermally conductive material being formed having a plurality of suspension tips, at least one suspension tip for engaging at least one surface of said plurality of said surfaces of said communication integrated circuit and for engaging at least one surface of said plurality of surfaces of said battery; and*

*suspending said communication integrated circuit and said battery within the low thermally conductive material by at least one suspension tip of the plurality of suspension tips of the low thermally conductive material contacting at least one surface of said plurality of surfaces of said communication integrated circuit and at least one suspension tip of the plurality of suspension tips contacting at least one surface of said plurality of surfaces of said battery.*

*59. The method of claim 58, wherein the low thermally conductive material has a thermal conductivity constant less than k=10.*

*60. The method of claim 58, wherein the low thermally conductive material includes polyester.*

*61. The method of claim 58, wherein said communication integrated circuit is separately suspended in the low thermally conductive material from said battery in the low thermally conductive material.*

*62. The method of claim 58, wherein said battery is suspended adjacent said communication integrated circuit in the low thermally conductive material.*

*63. The method of claim 58, further comprising the step of:*

*attaching said communication integrated circuit to said battery.*

*64. The method of claim 63, wherein the step of attaching said communication integrated circuit to said battery includes bonding said integrated circuit to said battery.*

*65. The method of claim 63, wherein the step of attaching said communication integrated circuit to said battery includes using epoxy to bond said communication integrated circuit to said battery.*

*66. The method of claim 63, wherein the step of suspending said battery within the low thermally conductive material includes:*

*suspending said communication integrated circuit and said battery within the low thermally conductive material by at*

*least one suspension tip of the plurality of suspension tips of the low thermally conductive material contacting at least one surface of said plurality of surfaces of said communication integrated circuit and at least one suspension tip of the plurality of suspension tips contacting at least one surface of said plurality of surfaces of the battery, the plurality of suspension tips of the low thermally conductive material forming areas of spaces therebetween.*

*67. The method of claim 66, further comprising the step of:*

*evacuating the areas of spaces formed between the plurality of suspension tips of the low thermally conductive material.*

*68. The method of claim 66, further comprising the step of:*

*placing insulating gas in the areas of spaces formed between the plurality of suspension tips of the low thermally conductive material.*

*69. The method of claim 66, further comprising the step of:*

*placing insulating gas in the areas of spaces formed between the plurality of suspension tips of the low thermally conductive material, the insulating gas being selected from the group consisting of argon, nitrogen, helium and air.*

*70. A method of making a radio frequency transceiver system including first and second sending/receiving units wherein said second sending/receiving unit includes a communication integrated circuit having a plurality of surfaces and a battery having a plurality of surfaces for powering said communication integrated circuit, said method comprising the step of:*

*forming a low thermally conductive material to enclose said communication integrated circuit and said battery therein, the low thermally conductive material being formed having a plurality of suspension tips for engaging at least one surface of said plurality of said surfaces of said communication integrated circuit and at least on surface of said plurality of surfaces of said battery;*

*bonding said communication integrated circuit to said battery; and*

*suspending said communication integrated circuit and said battery within the low thermally conductive material by at least one suspension tip of the plurality of suspension tips of the low thermally conductive material contacting at least one surface of said plurality of surfaces of said battery, the low thermally conductive material arching over said integrated circuit without making direct contact with the low thermally conductive material.*

*71. The method of claim 70, wherein the low thermally conductive material has a thermal conductivity constant less than k=10.*

*72. The method of claim 70, wherein thermally conductive material includes polyester.*

*73. The method of claim 70, wherein the step of bonding said communication integrated circuit to said battery includes using epoxy to bond said communication integrated circuit to said battery.*

*74. The method of claim 70, wherein the step of suspending said communication integrated circuit and said battery includes:*

*suspending said communication integrated circuit and said battery within the low thermally conductive material by at least one suspension tip of the plurality of suspension tips of the low thermally conductive material contacting at least one surface of said plurality of surfaces of said battery, the low thermally conductive material arching over said integrated circuit without making direct contact with the low thermally conductive materials, the plurality of suspension tips of the low thermally conductive material forming areas of spaces therebetween.*

*75. The method of claim 74, further comprising the step of:*

*evacuating the areas of spaces formed between the plurality of suspension tips of the low thermally conductive material.*

*76. The method of claim 75, further comprising the step of:*

*placing insulating gas in the areas of spaces formed between the plurality of suspension tips of the low thermally conductive material.*

*77. The method of claim 75, further comprising the step of:*

*placing insulating gas in the areas of spaces formed between the plurality of suspension tips of the low thermally conductive material, the insulating gas being selected from the group consisting of argon, nitrogen, helium and air.*

* * * * *